(12) United States Patent
Weekamp et al.

(10) Patent No.: US 8,351,222 B2
(45) Date of Patent: Jan. 8, 2013

(54) PACKAGE CARRIER FOR ENCLOSING AT LEAST ONE MICROELECTRONIC DEVICE

(75) Inventors: Johannes Wilhelmus Weekamp, Eindhoven (NL); Antonius Constan Johanna Cornelis Van Den Ackerveken, Eindhoven (NL); Will J. H. Ansems, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/196,002

(22) Filed: Aug. 2, 2011

(65) Prior Publication Data

US 2011/0292633 A1   Dec. 1, 2011

Related U.S. Application Data

(62) Division of application No. 12/092,835, filed on May 7, 2008, now Pat. No. 8,011,082.

(30) Foreign Application Priority Data

Nov. 9, 2005   (EP) .................................... 05110522

(51) Int. Cl.
    *H05K 7/00* (2006.01)
(52) U.S. Cl. ............. 361/820; 361/306.3; 361/704; 361/783; 174/542; 174/551; 174/560; 257/100; 257/678; 257/680; 257/701; 257/704; 257/710; 257/712; 438/64; 438/106; 156/64; 156/292; 73/127
(58) Field of Classification Search .......... 361/820, 361/306.3, 704, 764, 783; 174/542, 551, 174/560; 257/100, 678, 680, 701, 704, 710, 257/712; 438/64, 106; 156/64, 292; 73/127
See application file for complete search history.

(56) References Cited

U.S. PATENT DOCUMENTS

| 4,026,412 | A |   | 5/1977 | Henson |
|---|---|---|---|---|
| 4,054,938 | A | * | 10/1977 | Morris, Sr. ............... 361/764 |
| 4,618,739 | A | * | 10/1986 | Theobald .................. 174/551 |
| 5,285,690 | A | * | 2/1994 | Koen et al. .............. 73/727 |
| 5,407,501 | A | * | 4/1995 | Koen et al. ................ 156/64 |
| 5,438,478 | A | * | 8/1995 | Kondo et al. ............. 361/704 |
| 5,451,722 | A |   | 9/1995 | Gregoire |
| 5,753,857 | A | * | 5/1998 | Choi ....................... 174/542 |
| 5,814,883 | A | * | 9/1998 | Sawai et al. .............. 257/712 |
| 5,833,903 | A | * | 11/1998 | Centofante .............. 264/155 |

(Continued)

FOREIGN PATENT DOCUMENTS

DE   103423256 B4   5/2005

(Continued)

*Primary Examiner* — Xiaoliang Chen

(57) ABSTRACT

A package enclosing at least one microelectronic element (60) such as a sensor die and having electrically conductive connection pads (31) for electric connection of the package to another device is manufactured by providing a sacrificial carrier; applying an electrically conductive pattern (30) to one side of the carrier; bending the carrier in order to create a shape of the carrier in which the carrier has an elevated portion and recessed portions; forming a body member (45) on the carrier at the side where the electrically conductive pattern (30) is present; removing the sacrificial carrier; and placing a microelectronic element (60) in a recess (47) which has been created in the body member (45) at the position where the elevated portion of the carrier has been, and connecting the microelectronic element (60) to the electrically conductive pattern (30). Furthermore, a hole (41) is arranged in the package for providing access to a sensitive surface of the microelectronic element (60).

11 Claims, 13 Drawing Sheets

U.S. PATENT DOCUMENTS

| | | | |
|---|---|---|---|
| 5,986,459 A * | 11/1999 | Fukaya et al. | 324/756.02 |
| 6,031,284 A * | 2/2000 | Song | 257/701 |
| 6,121,675 A * | 9/2000 | Fukamura et al. | 257/680 |
| 6,379,988 B1 | 4/2002 | Peterson et al. | |
| 6,379,997 B1 * | 4/2002 | Kawahara et al. | 438/106 |
| 6,433,411 B1 * | 8/2002 | Degani et al. | 257/678 |
| 6,515,355 B1 * | 2/2003 | Jiang et al. | 257/678 |
| 6,528,351 B1 | 3/2003 | Nathan et al. | |
| 6,528,875 B1 * | 3/2003 | Glenn et al. | 257/704 |
| 6,617,786 B1 * | 9/2003 | Centofante | 313/512 |
| 6,759,738 B1 * | 7/2004 | Fallon et al. | 257/690 |
| 6,845,664 B1 * | 1/2005 | Okojie | 73/431 |
| 7,276,394 B2 * | 10/2007 | Waldman et al. | 438/64 |
| 7,327,554 B2 * | 2/2008 | Otsuka et al. | 361/306.3 |
| 7,601,039 B2 | 10/2009 | Eldridge et al. | |
| 2003/0157437 A1 * | 8/2003 | Yamamoto et al. | 430/311 |
| 2004/0046248 A1 * | 3/2004 | Waelti et al. | 257/712 |
| 2004/0125578 A1 * | 7/2004 | Konishi et al. | 361/783 |
| 2004/0264866 A1 * | 12/2004 | Sherrer et al. | 385/49 |
| 2005/0082648 A1 | 4/2005 | Naito et al. | |
| 2005/0258447 A1 * | 11/2005 | Oi et al. | 257/100 |
| 2008/0191227 A1 * | 8/2008 | Kimura et al. | 257/98 |
| 2008/0299013 A1 * | 12/2008 | Trieu et al. | 422/104 |

FOREIGN PATENT DOCUMENTS

| | | |
|---|---|---|
| EP | 1130646 A1 | 9/2001 |
| WO | 03085732 A1 | 10/2003 |
| WO | 2005038911 A1 | 4/2005 |

* cited by examiner

PACKAGE CARRIER FOR ENCLOSING AT LEAST ONE MICROELECTRONIC DEVICE

This is a divisional of prior application Ser. No. 12/092,835 filed May 7, 2008 and is incorporated by reference herein.

The present invention relates to a method of manufacturing a package carrier suitable for enclosing at least one microelectronic element and having electrically conductive pads for electric connection of the package carrier to another device. Also, the present invention relates to a method of manufacturing a package enclosing at least one microelectronic element, which is based on the method of manufacturing the package carrier, and a method of manufacturing a device which is applicable for diagnostic purposes. Furthermore, the present invention relates to a package carrier suitable for enclosing at least one microelectronic element, a package comprising the package carrier and at least one microelectronic element, and a device which is applicable for diagnostic purposes.

Packages enclosing at least one microelectronic element are well-known, and various types of such packages have been developed. In general, dimensions of the packages are in the millimeter range. The packages have various functions. Among other things, the packages serve for protecting the microelectronic element and allowing for easy connection of the microelectronic element to another device. The microelectronic element may be a processor chip, a MEMS microphone, wherein MEMS stands for Micro ElectroMechanical System, a transistor, a diode, a passive component, a biosensor die, a chemical sensor die, etc.

In the field of packages for sensor dies, it is important that the package allows for controlled interaction between the enclosed die and the external world. For example, in case the package encloses a biosensor die which is suitable to be operated for the purpose of determining a property of a blood sample, the package needs to allow for contact between the blood and a sensitive surface of the sensor die.

A package enclosing at least one microelectronic element and a method of manufacturing a diagnostic device are known from WO-A 2005/38911. The known package is an insulating plate with conductors on a first side, and a recess extending from the first to an opposite second side of the insulating plate. The plate is suitably made by insert molding. The conductors are therein provided on a sacrificial carrier, of which a portion is removed after the molding operation. A sensor die or chip is then positioned on the first side so as to cover the recess, such that it has one surface exposed in the recess. This surface is for instance a sensor surface on which parts in a fluid to be analyzed can absorb. Channels may be defined on the second side of the plate so as to improve the flow of fluid to the chip. This package has the advantage that the fluid processing is separated from the conductors.

It is a disadvantage of the known package that the provision of a recess extending through the plate is not easy or cheap, if the recess must have a sufficiently small diameter so as to be covered by a chip. Such a construction requires a mould of very high quality, and thus of high price. Moreover, the closing of a mould may not damage the sacrificial carrier and/or any of the conductors thereon, while the conductors are preferably designed near to an edge of the aperture.

It is therefore an objective to provide an improved method of manufacturing a package carrier suitable for enclosing at least one microelectronic element, which method is relatively simple but accurate, and which method allows for manufacturing arrays of package carriers by using standard materials and processes, while offering a possibility of manufacturing a package carrier suitable for enclosing at least one sensor die.

The objective is achieved by a manufacturing method which comprises the following steps:

providing a sacrificial carrier having a carrying surface and a pattern of electrically conductive connection pads and electrically conductive tracks at the carrying surface, further having a covering member having at least one hole that is positioned on the carrying surface, and covering at least part of said pattern of pads and tracks;

bending the sacrificial carrier in order to create a shape of the carrier in which the carrier has at least two portions which are at a different level, such that the hole in the covering member and a top portion of the covering member circumfering the hole are present at a higher level;

forming a body member by applying material to the sacrificial carrier, at the side where the electrically conductive pattern is present, while leaving the top portion of the covering member free; and removing at least a portion of the sacrificial carrier, therewith creating a recess with at least one electrically conductive connection pad of the pattern suitable for electrically coupling to a microelectronic element, which recess extends to the hole in the covering member.

All steps of the method according to the present invention require nothing more than an application of existing techniques. For example, a person skilled in the art is familiar with the application of a sacrificial carrier for the purpose of temporarily carrying a pattern of electrically conductive connection pads and electrically conductive tracks.

For sake of completeness, with respect to the sacrificial carrier, it is noted that such a carrier often comprises a number of layers. A well-known example is a carrier comprising two layers, namely a layer of copper and a layer of aluminum. In general, a sacrificial carrier serves for temporarily carrying a pattern of electrically conductive pads and/or electrically conductive tracks which need to be applied to a body member. After the body member has been made, for example by overmolding the carrier at the side where the pattern is located, the carrier may be partially or completely removed. In the process, a suitable technique such as etching is applied.

A notable feature of the method according to the present invention is that the sacrificial carrier is bent in order to create a shape of the carrier in which the carrier has at least two portions which are at a different level. In this way, a simple solution is provided for the problem of creating a recess for receiving a microelectronic element. When the body member is formed, the recess is automatically obtained as a result of the level difference of the carrier portions.

After the manufacture of the package carrier, a microelectronic element may be coupled to at least one electrically conductive connection pad of the pattern in the recess. This may be carried out by applying any suitable connecting technique, for example soldering or ultrasonic bonding. When a so-called flip-chip bonding technique is applied, the actual connection is established in a following step, under the influence of heat, reflow or ultrasonic vibrations, for example. The positioning of the microelectronic element in the recess has the advantage that the microelectronic element is moved towards another side without making the body member very fragile. Moreover, due to the positioning in the recess, the microelectronic element may be encapsulated afterwards.

The invention, moreover, relates to creating a hole having predetermined dimensions and a predetermined position at a bottom of the recess for receiving the microelectronic element. According to the invention, a covering member having at least one hole is applied to the body member. The covering member may be patterned with a high resolution, by photolithography, inkjet printing, screen printing or the like, so that the diameter of the recess/through-hole through the body member may be much smaller than in the prior art. Additionally, the covering member prevents a direct interaction between a mould and the conductors, in the preferred case of molding. Also, it is possible to position the hole with high accuracy, which is especially important in case an array of packages is manufactured. The covering member may for example be shaped like a thin strip with a hole arranged at its center. A suitable material is an electrically non-conductive material, for example a material known as solder resist.

A practical way of forming the body member of the package carrier involves the application of a mould, wherein a space for receiving the material which is applied for forming the body member is created by putting the mould and the sacrificial carrier in a predetermined position with respect to each other. When a covering member having at least one hole has been applied to the sacrificial carrier, the hole is kept open when the mould comprises a projection for preventing the material from covering at least a portion of the covering member, in particular a portion where the at least one hole is present. Therefore, in such a case, the application of a mould having such a projection is preferred.

In an advantageous embodiment, the projection of the mould is adapted to forming a trough-like recess in the body member, which extends from one side of the body member to an opposite side of the body member. In that case, it is possible to create a trough-like recess in the body member, in such a way that the covering member having at least one hole is at a bottom of the recess. In the package which is obtained as a result of the manufacturing method, this recess allows for an easy supply of fluid to the microelectronic element, through the hole.

The at least one hole which is created may be as shallow as possible. In case a covering member having the at least one hole is applied, the covering member may be as thin as possible. In this way, a package is obtained, in which a level of a sensitive surface of the microelectronic element deviates just a little from a level of a surface along which a fluid is conducted, so that a flow of the fluid is hardly disturbed by the presence of the hole, and it is achieved that all of the fluid comes into contact with the sensitive surface of the microelectronic element. Suitably, a trough-like recess is created in the body member. This may be achieved with a mould having a projection.

In a particular way of carrying out the method according to the present invention, in case a mould is applied in the process of forming the body member, and a trough-like recess is formed in the body member by a projection of the mould, during the step of positioning the mould and the sacrificial carrier with respect to each other, a longitudinal axis of the projection of the mould is placed at right angles with respect to a longitudinal axis of a portion of the carrying surface of the carrier which is at a higher level than another portion. In this way, a package is obtained which is robust, in spite of the presence of the relatively thin area where the at least one hole is present. In fact, the dimensions of this relatively thin area are limited to the dimensions of an area in which bottoms of the recess for receiving the microelectronic element and the trough-like recess cross.

Advantageously, in order to ensure a good protection of the microelectronic element, the recess in the body member which is present at a side where the removed portion of the sacrificial carrier has been is closed after the microelectronic element has been put in place in the recess and has been connected to at least one electrically conductive connection pad. For example, the recess is filled with material, wherein the microelectronic element gets encapsulated in the material.

When the package needs to enclose another microelectronic element, which may be completely enclosed by the body member of the package, a portion of the carrying surface of the sacrificial carrier, which is at a lower level than another portion, may be applied for the purpose of temporarily supporting such a microelectronic element, wherein the element is connected to at least one electrically conductive connection pad of the pattern which is present on the carrying surface. The processes of putting the microelectronic element in place and establishing the necessary electric connection are performed prior to the process of forming the body member. After the body member has been formed, the microelectronic device is embedded in the body member, and does no longer need to be supported by the sacrificial carrier.

The method according to the present invention is very well applicable for the purpose of manufacturing an array of packages. In general, manufacturing an array of packages involves simultaneously manufacturing a number of packages, wherein the packages are arranged in rows and columns. When all packages are ready, the array is diced, so that separate packages are obtained. Advantageously, in case a package is manufactured as a part of an array of packages, the sacrificial carrier which is used in the process of manufacturing the package is part of a larger sacrificial carrier which is bent in order to create a corrugated shape of the sacrificial carrier. This is an easy way of creating a shape of the sacrificial carrier in which the carrier has at least two portions which are at a different level, for all packages of the array.

The package manufacturing method according to the present invention, wherein at least one hole is created in the package for allowing for an interaction between the enclosed microelectronic element and the external world, may be applied in a process of manufacturing a device which is applicable for diagnostic purposes. In many cases, such a process further involves the step of applying at least one reagent to the body of the package.

When the diagnostic device is operated, a fluid which needs to be examined is put into contact with the reagent first, as a result of which the fluid is put in a state which is needed in view of examination by the microelectronic element. For example, certain molecules which are present in the fluid are labeled in a manner known per se, so that the microelectronic element is capable of detecting the molecules. Subsequently, the fluid is put into contact with the sensitive surface of the microelectronic element, through the at least one hole.

Preferably, for the purpose of obtaining a controlled supply of fluid, a member which is adapted to conducting a fluid, in particular to putting the fluid in contact with the at least one reagent, and to conducting the fluid toward at least one hole through which the microelectronic element is accessible, is provided. When a trough-like recess is formed in the body member of the package, this recess may be used for accommodating at least a part of the member which is adapted to conducting a fluid. For example, the member which is adapted to conducting a fluid may comprise a plate having a pattern of channels for conducting a fluid, which is present at one side of the plate. Also, the member which is adapted to conducting a fluid may comprise a bent hose, wherein the hose comprises a hole at the place where the hose is in contact with the package, in order to allow for the necessary contact between a fluid to be examined on the one hand and the reagent and the sensitive surface of the microelectronic element on the other hand.

The present invention will now be explained in greater detail with reference to the Figs., in which similar parts are indicated by the same reference signs, and in which:

FIGS. 1a to 1j illustrate subsequent steps of a process of manufacturing a package according to a first preferred embodiment of the present invention, wherein FIG. 1a shows a bottom part of a mould which is applied in the process;

FIGS. 2a to 2d illustrate subsequent steps of a process of manufacturing a diagnostic device comprising the package according to the first preferred embodiment of the present invention, wherein FIG. 2b shows a portion of a hose which is applied in the process;

FIGS. 4a to 4i illustrate subsequent steps of a process of manufacturing a diagnostic device according to a second preferred embodiment of the present invention, wherein FIG. 4i shows a microfluidic plate which is applied in the process.

FIGS. 1a to 1j illustrate subsequent steps of a process of manufacturing a package according to a first preferred embodiment of the present invention. For sake of clarity, in the following, the package according to the first preferred embodiment of the present invention will be referred to as first package.

Figure 1A:
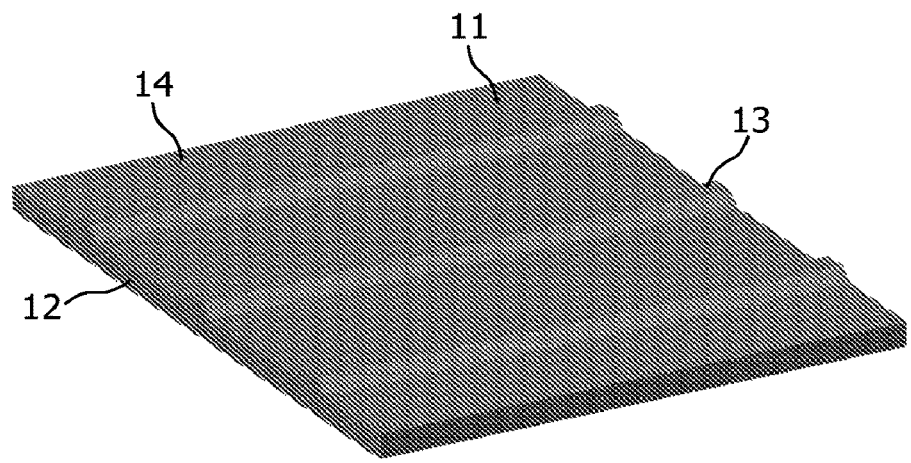

In the process of manufacturing the first package, a mould comprising two mould parts is applied. In FIG. 1a, a bottom part 11 of the mould is shown. The bottom part 11 of the mould comprises a plate 12 having a number of elongated corrugations 13, which extend substantially parallel with respect to each other, at a predetermined distance, and which are arranged on an upper surface 14 of the bottom part 11. In the shown example, the corrugations 13 have a trapezoidal cross section.

Figure 1B:
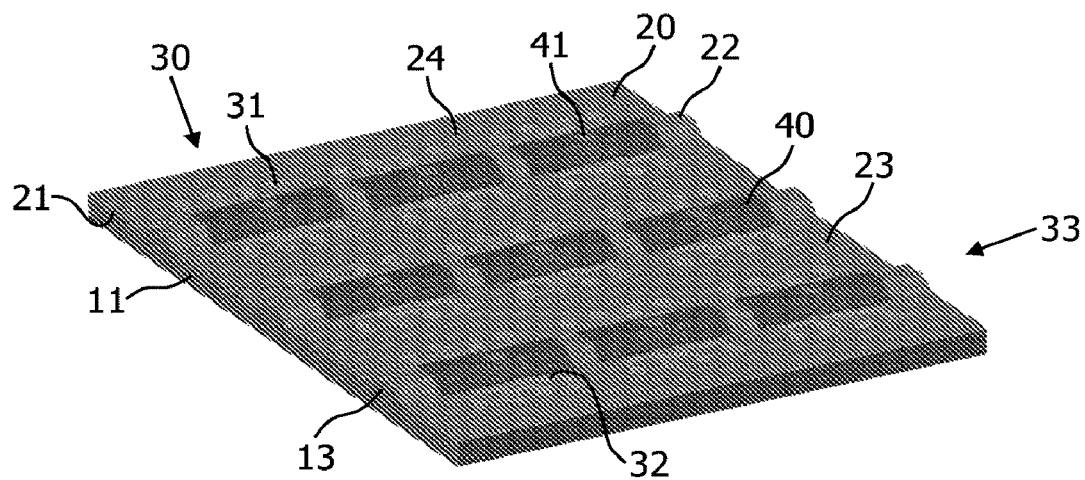

In a first step of the process of manufacturing the first package, which is illustrated by FIG. 1b, a sacrificial carrier 20 is placed on the bottom part 11 of the mould. The carrier 20 comprises a sheet of a material which is to be removed at a later stage in the manufacturing process. For example, the carrier 20 comprises a sheet of copper. In the process of placing the carrier 20 on the bottom part 11 of the mould, the carrier 20 is bent, such that an under surface 21 of the carrier 20 fits the upper surface 14 of the bottom part 11 of the mould, wherein there is practically no space present between these two surfaces 14, 21. As a result, a corrugated shape of the carrier 20 is obtained, wherein the carrier 20 comprises elevated portions 22 and recessed portions 23.

At an upper surface 24, the carrier 20 is provided with a pattern 30 of electrically conductive connection pads 31 and electrically conductive tracks 32. In the following, for sake of clarity, the upper surface 24 of the carrier 20 is referred to as carrying surface 24.

In the example as shown in FIG. 1b, the carrier 20 is used in a process of manufacturing an array of packages. Therefore, the carrier 20 as shown is provided with more than one electrically conductive pattern 30. In particular, in the shown example, three rows 33 of patterns 30 have been arranged on the carrying surface 24 of the carrier 20, wherein each row 33 comprises three patterns 30. Furthermore, a direction of the rows 33 of patterns 30 substantially equals the direction of a longitudinal axis 22l of the elevated portions 22 of the carrier 20, and a central portion of the patterns 30 is located on the elevated portions 22. It is noted that when the present invention is applied for the purpose of manufacturing an array of packages, the number of packages may be chosen freely.

The central portions of the electrically conductive patterns 30 are covered by a layer 40 of electrically insulating material, for example a material known as solder resist, which is an organic material such as an epoxy material or an acrylic material. At a central position, the layer 40 is interrupted, such that a central hole 41 is obtained in the layer 40. In the following, for sake of clarity, the layer 40 of electrically insulating material will be referred to as covering member 40.

Figure 1C:
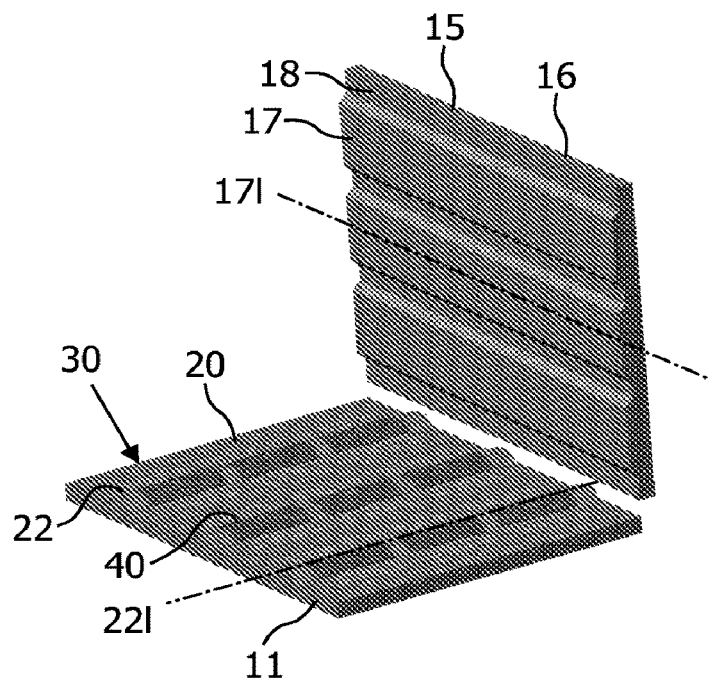

After the carrier 20 has been placed on the bottom part 11 of the mould, a top part 15 of the mould is positioned above the carrier 20. In FIG. 1c, both the carrier 20 and the top part 15 of the mould are shown. Like the bottom part 11 of the mould, the top part 15 of the mould comprises a plate 16 having a number of elongated corrugations 17, which extend substantially parallel with respect to each other, at a predetermined distance, and which are arranged on an under surface 18 of the top part 15. In the shown example, the corrugations 17 have a trapezoidal cross section.

Figure 1D:
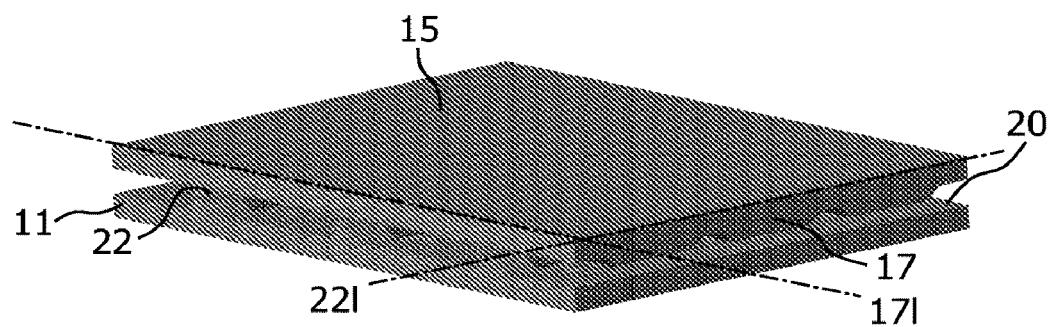

The way in which the top part 15 of the mould is positioned with respect to the carrier 20 is illustrated by FIG. 1d. A first notable aspect of the mutual position of the top part 15 of the mould and the carrier 20 is that a longitudinal axis 17l of the corrugations 17 of the top part of the mould and the longitudinal axis 22l of the elevated portions 22 of the carrier 20 extend at right angles with respect to each other. A second notable aspect of the mutual position of the top part 15 of the mould and the carrier 20 is that the corrugations 17 of the top part of the mould contact the covering members 40 which are present on the elevated portions 22 of the carrier 20.

Figure 1E:
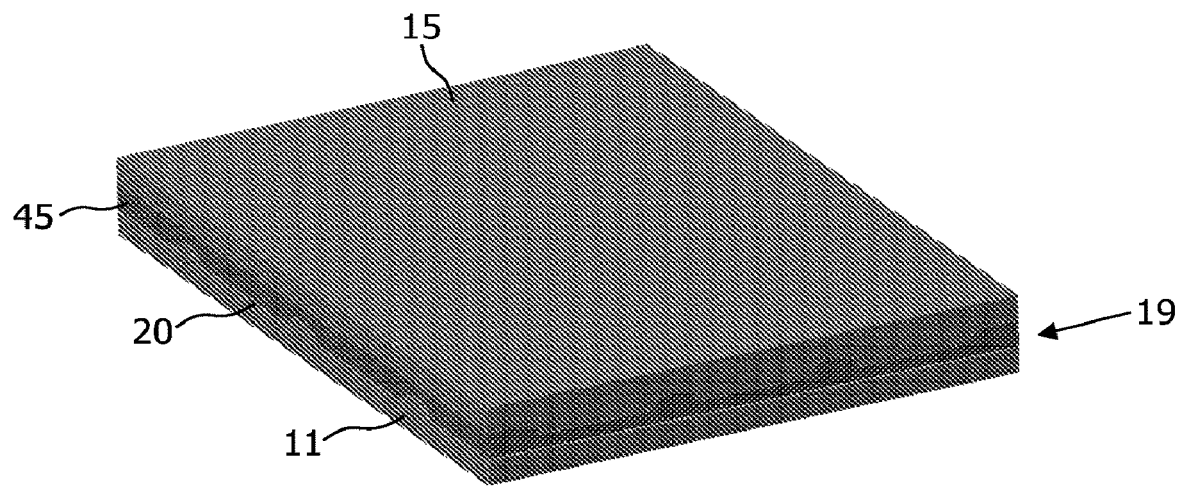

After the top part 15 of the mould has been put in the right position with respect to the carrier 20, a space 19 which is present between the carrier 20 and the top part 15 of the mould is filled with a material like epoxy resin, for the purpose of forming a body member 45 of the packages. In the process, any suitable technique may be applied, for example injection molding. In FIG. 1e, a filled condition of the space 19 is illustrated.

Figure 1F:
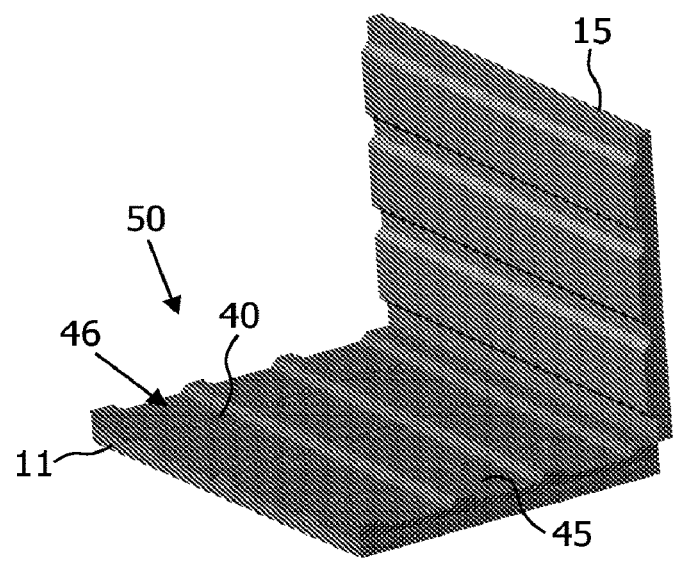

In subsequent steps of the manufacturing method, the material of the body member 45 is allowed to cure, and the top part 15 of the mould is removed. The step of removing the top part 15 of the mould is illustrated by FIG. 1f. At a side which is shown in FIG. 1f, the body member 45 comprises trough-like recesses 46 in which top sides of the covering members 40 are present.

Figure 1G:
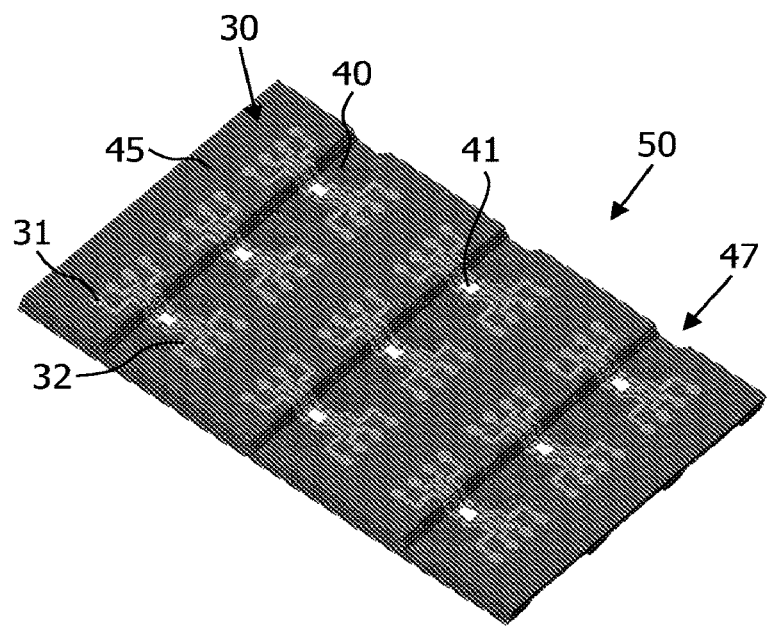

After the body member 45 has been allowed to cure, there is no longer a need for having a carrier 20 for supporting the covering members 40 and the patterns 30 of electrically conductive connection pads 31 and electrically conductive tracks 32. Therefore, the carrier 20 is removed by chemical etching, peeling, or another suitable technique. A top side of the obtained array 50 of packages in the process of formation is shown in FIG. 1f, whereas a bottom side of this array 50, which is a side of the array 50 where the carrier 20 has been, is shown in FIG. 1g. At the bottom side of the array 50, at the positions where the elevated portions 22 of the carrier 20 have been, through-like recesses 47 have been formed, in which the central portions of the electrically conductive patterns 30 are present, and in which major parts of the covering members 40 are present, wherein the covering members 40 are arranged behind the patterns 30. Furthermore, as a result of the removal of the carrier 20, the holes 41 of the covering members 40 are open.

Figure 1H:
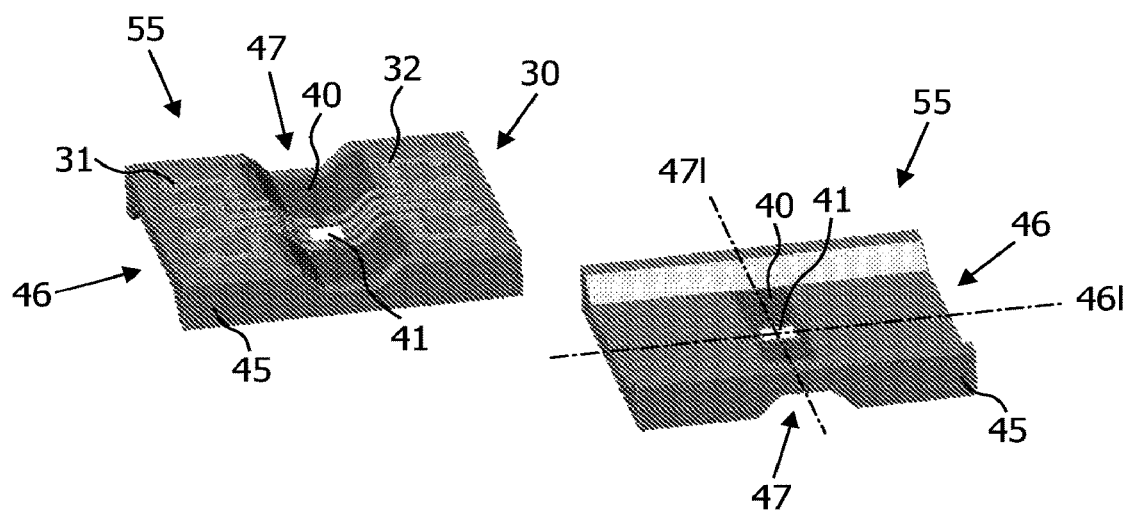
Figure 1I:
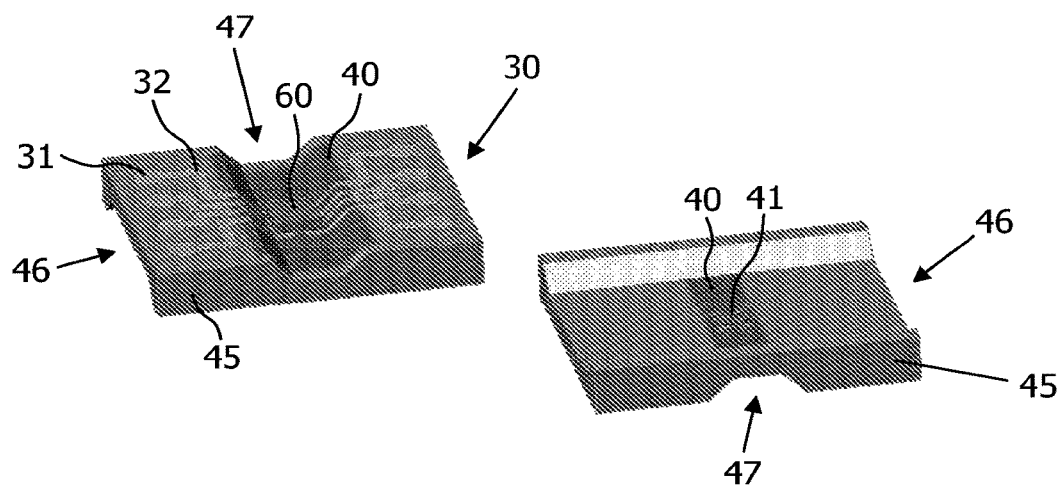
Figure 1J:
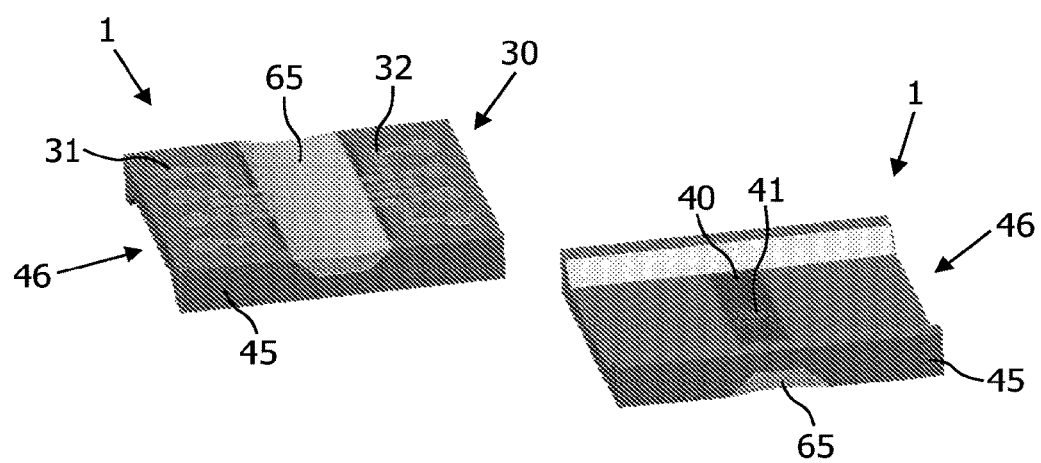

In FIGS. 1h to 1j, the next steps of the manufacturing method are shown in respect of a single package. However, it is just as well possible that these steps are performed on an array 50 of packages. Individual packages are obtained by dicing the array 50 of packages. For sake of completeness, it is noted that each of the FIGS. 1h to 1j shows two different sides of the package in the process of formation.

The package in the process of formation, which is obtained after the sacrificial carrier 30 has been removed, and which is not yet equipped with a microelectronic element, is also referred to as package carrier 55. In FIG. 1h, it is shown that an individual package carrier 55 comprises a body member 45, a covering member 40, and a pattern 30 of electrically conductive connection pads 31 and electrically conductive tracks 32. In particular, at a side where the carrier 20 has been, which will be referred to as under side, a through-like recess 47 is present, which is covered by the covering member 40. Furthermore, at the under side of the package carrier 55, the pattern 30 of electrically conductive connection pads 31 and electrically conductive tracks 32 is present. At another side of the package carrier 55, which will be referred to as upper side, a trough-like recess 46 is present, and a top side of the covering member 40 is located at a bottom of this recess 46. Longitudinal axes 46l, 47l of the recesses 46, 47 at the various sides of the body member 45 are at right angles with respect to each other. At a position where bottoms of the recesses 46, 47 cross, the package carrier 55 only comprises the covering member 40. As a consequence, at this position, the package carrier 55 is relatively thin, and the package carrier 55 comprises a hole 41 which allows for access from the one recess 46 to the other recess 47.

In one of the final steps of the manufacturing method, which is illustrated by FIG. 1i, a microelectronic element 60, for example a sensor die, is placed in the recess 47 at the under side of the package carrier 55, at the location of the hole 41. Furthermore, the microelectronic element 60 is connected to at least one of the connection pads 31 which are present near the hole 41, by means of a suitable connecting technique such as soldering or ultrasonic bonding.

Subsequently, the recess 47 containing the microelectronic element 60 is closed by filling the recess 47 with a suitable material such as epoxy resin. In the process, the microelectronic element 60 gets encapsulated in a filler body 65 which is formed in this way. This step of closing the recess 47, which is illustrated by FIG. 1j, is the final step of the formation of the package 1. In case the package 1 is manufactured as part of an array 50 of packages 1, and has not been separated from the other packages 1 yet, a process of dicing the array 50 is performed.

It is noted that in principle, the recess 47 does not necessarily need to be closed, but in many cases, it may be preferred to do so, for the purpose of obtaining a good protection for the microelectronic element 60.

In the first package 1 which is obtained as a result of the manufacturing process as described on the basis of FIGS. 1a to 1j, the microelectronic element 60 is safely embedded in the filler body 65. The recess 47 in which the microelectronic element 60 is located is obtained in an easy manner, namely by bending a sacrificial carrier 20 in such a way that a corrugated appearance of this carrier 20 is obtained. At the location of an elevated portion 22 which is formed in the carrier 20 in this way, the recess 47 is automatically obtained when the carrier 20 is covered by material for the purpose of forming a body member 45 of the package 1.

Although the microelectronic element 60 is embedded in the filler body 65, it is still very easy to access the microelectronic element 60 in a proper manner. In the first place, the microelectronic element 60 is easily connectable to another electronic device, through the tracks 32 and connection pads 31 of the pattern 30, which are present at the under side of the body member 45, while extending outside of the recess 47, and which are directly connected to the microelectronic element 60. In the second place, a surface of the microelectronic element 60 is accessible from the upper side of the body member 45, through the hole 41. In case the microelectronic element 60 is a sensor die, this feature is very advantageous, as a sensitive surface of such a die may be located right underneath the covering member 40, so that it is accessible by fluids to be examined, etc., while the rest of the die is safely enclosed by the package 1.

An advantage of the perpendicular configuration of the recesses 46, 47 is that an area where the package 1 only comprises the relatively thin covering member 40 is as small as possible. In this way, the package 1 may still be as robust as possible.

It is noted that it is not necessary to apply a covering member 40. In principle, the covering member 40 may be omitted, and the top part 15 of the mould may be adapted to the purpose of forming a relatively thin area having at least one hole 41. However, when this way of forming the hole 41 and a surrounding area is carried out in practice, there is a chance of the hole 41 getting obstructed by means of a thin layer of material which is used in the process of forming the body member 45, so that extra actions, aimed at removing the thin layer, need to be taken. Also, it is more difficult to put the hole 41 exactly at a desired position, as this alternative way of creating the hole 41 is less accurate.

The first package 1 is suitable to be used as a part of a device which is applicable for diagnostic purposes. A method of manufacturing such a device 5, starting from the first package 1, is illustrated by FIGS. 2a to 2d.

Figure 2A:
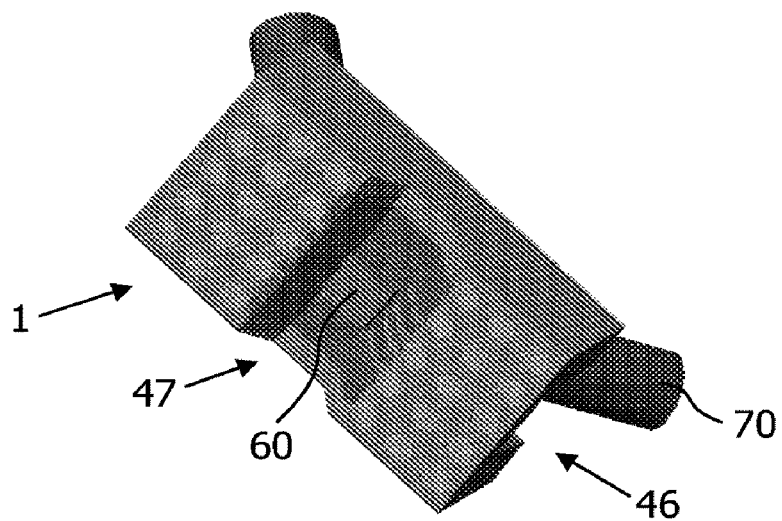
Figure 2B:
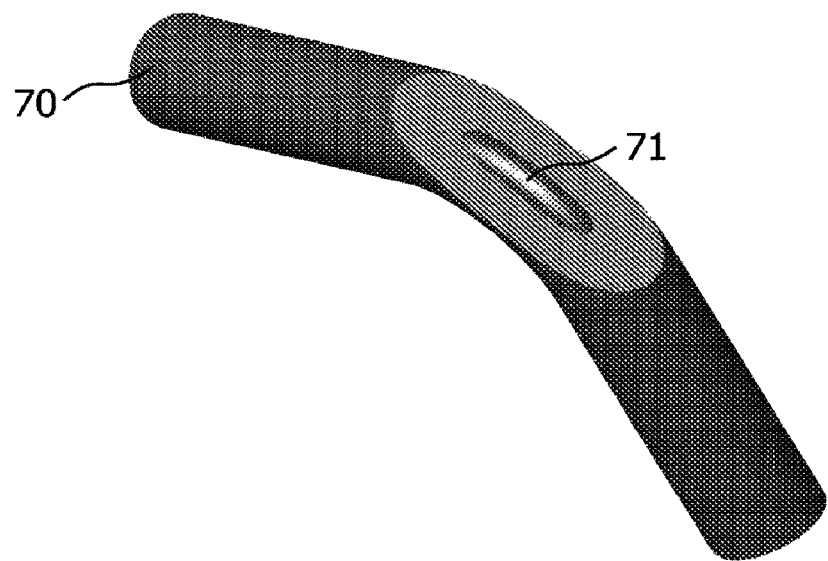

In FIG. 2a, the first package 1 is shown, wherein the recess 47 containing the microelectronic element 60 is still open. In the recess 46 at the upper side of the package 1, a member which is adapted to conducting a fluid is arranged. In the shown example, the member which is adapted to conducting a fluid comprises a bent hose 70, which comprises a hole 71 at the place where the hose 70 is in contact with the package 1, in order to allow for contact between a fluid to be examined on the one hand and a sensitive surface of the microelectronic element 60 on the other hand. A portion of the hose 70 is shown in FIG. 2b. The hole 71 in the hose 70 is simply obtained by cutting off a portion of the hose 70, at the position where the hose 70 is bent.

Figure 2C:
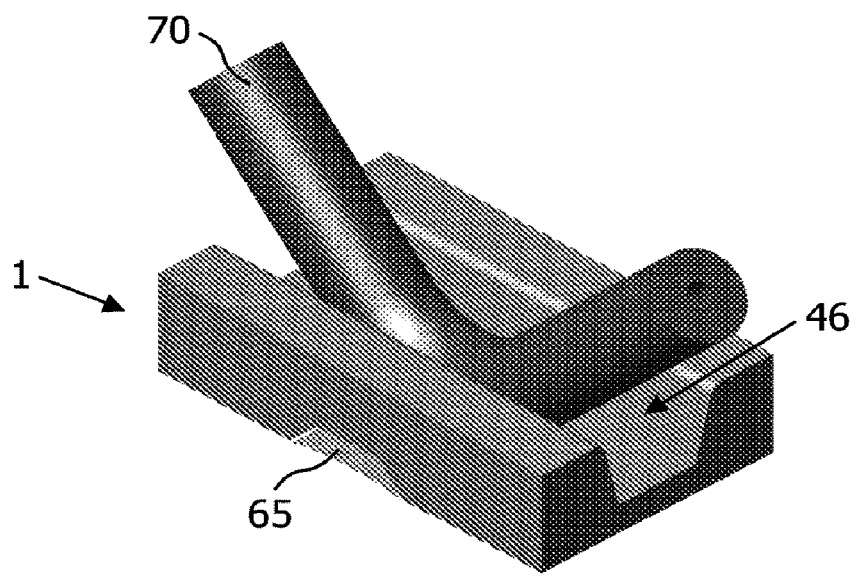
Figure 2D:
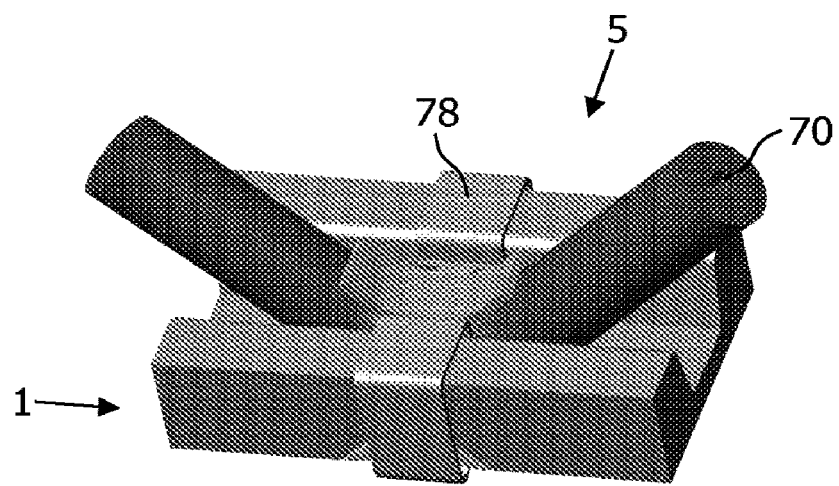

In FIG. 2c, a further step of the manufacturing process of the diagnostic device 5 is illustrated. During this step, the recess 47 in which the microelectronic element 60 is located is closed. In yet another step, which is illustrated by FIG. 2d, the hose 70 is firmly attached to the package 1 by means of a strap-like attaching member 78. By means of the attaching member 78, the hose 70 is fixed in a proper position and pressed against the package 1, so that fluid which is conducted by the hose 70 during operation of the diagnostic device 5 does not leak away when it reaches the hole 71 in the hose 70.

When the diagnostic device 5 is operated, a fluid to be examined is conducted by the hose 70. In the process, the fluid contacts the sensitive surface of the microelectronic element 60 which is enclosed by the package 1 of the diagnostic device 5, so that the microelectronic element 60 is capable of measuring certain properties of the fluid. Output which is provided by the microelectronic element 60 and which is representative of the properties of the fluid may be derived from the diagnostic device 5 in a most convenient manner, namely by connecting at least one electronic device to at least one of the connection pads 31 which are freely accessible at the under side of the package 1.

In the package 1, the microelectronic element 60 is positioned right underneath the hole 41, which is very shallow, as the covering member 40 is very thin. An important advantage which is related to this feature of the package 1 is that during operation of the diagnostic device 5, the flow of fluid in the hose 70 is hardly hindered by the presence of the hole 41, and there is no risk of fluid staying behind in the hole 41, so that there is no risk of the measuring results getting disturbed by any of such unwanted effects.

FIGS. 3a to 3f illustrate subsequent steps of a process of manufacturing a package according to a second preferred embodiment of the present invention. For sake of clarity, in the following, the package according to the second preferred embodiment of the present invention will be referred to as second package.

In each of FIGS. 3a to 3f, both a perspective view of an under side of the package in the process of formation and a perspective view of an upper side of the package in the process of formation are shown. In the following, the manufacturing process will be described for one package. Nevertheless, like the first package 1, the second package may be manufactured as part of an array of packages.

Figure 3A:
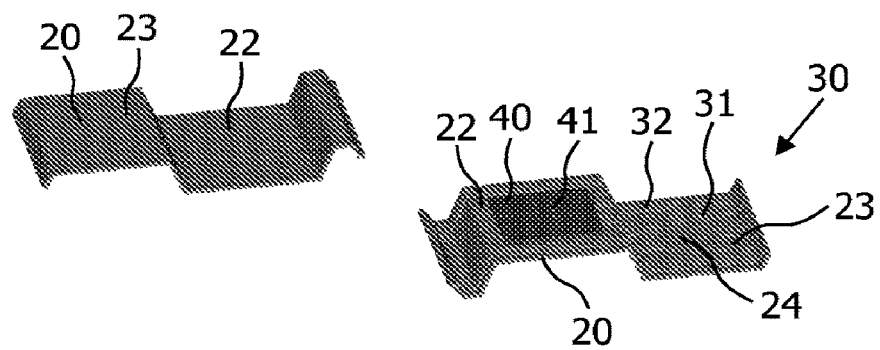
FIGS. 3a to 3f illustrate subsequent steps of a process of manufacturing a package according to a second preferred embodiment of the present invention.

In a first step of the process of manufacturing the second package, which is illustrated by FIG. 3a, a sacrificial carrier 20 is provided. The carrier 20 comprises a sheet of material, for example copper. At a carrying surface 24, the carrier 20 is provided with a pattern 30 of electrically conductive connection pads 31 and electrically conductive tracks 32.

The carrier 20 is bent in such a way that two portions 22, 23 which are located at a different level are obtained. In particular, after bending of the carrier 20 has taken place, an elevated portion 22 and a recessed portion 23 of the carrying surface 24 are discernible. At the elevated portion 22 of the carrying surface 24 of the carrier 20, a covering member 40 is arranged in the form of a thin layer of electrically insulating material having a plurality of tiny holes 41.

Figure 3B:
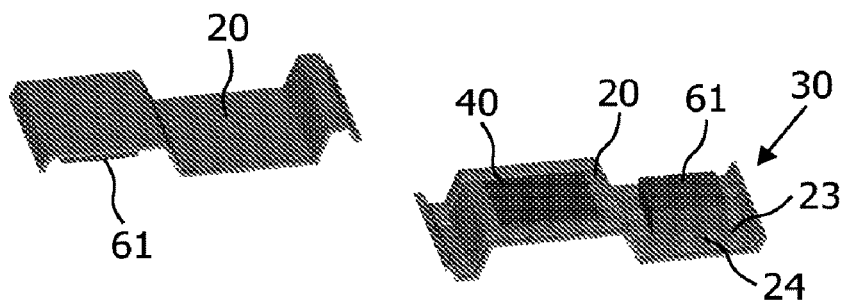

In a second step of the process of manufacturing the second package, which is illustrated by FIG. 3b, a processor chip 61 or another suitable microelectronic element is positioned on the recessed portion 23 of the carrying surface 24, wherein an electric connection between the processor chip 61 and the electrically conductive pattern 30 is realized.

Figure 3C:
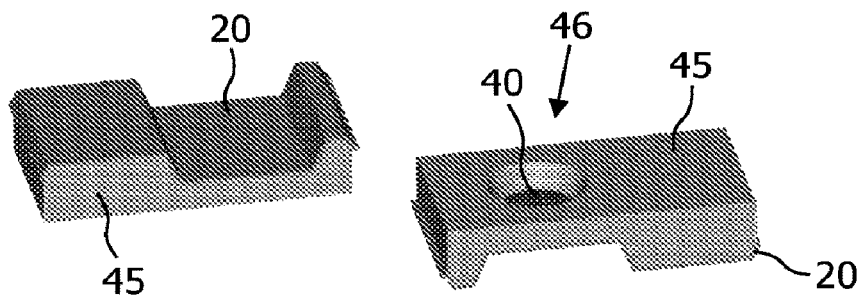

In a third step of the process of manufacturing the second package, which is illustrated by FIG. 3c, the carrier 20 and the components 30, 40, 61 arranged on its carrying surface 24 are overmolded with a suitable material, on the basis of which a body member 45 is formed on the carrier 20, at the side of the carrying surface 24. In the process, the processor chip 61 gets encapsulated in the body member 45.

Preferably, the body member 45 of the package is formed by applying a mould having a bottom part and a top part, like the mould which is suitable to be used in the process of manufacturing the first package 1, wherein the carrier 20 is placed on the bottom part of the mould. The top part of the mould which is suitable to be used in the process of manufacturing the second package comprises a pin-shaped projection. When the package in the process of formation is positioned in the mould in a proper manner, an end of the pin-shaped projection contacts a portion of the covering member 40, so that this portion of the covering member 40 does not get covered by material which is introduced in the mould for the purpose of creating the body member 45. In stead, a recess 46 is obtained in the body member 45, wherein a top side of the covering member 40 is located at the bottom of the recess 46.

Figure 3D:
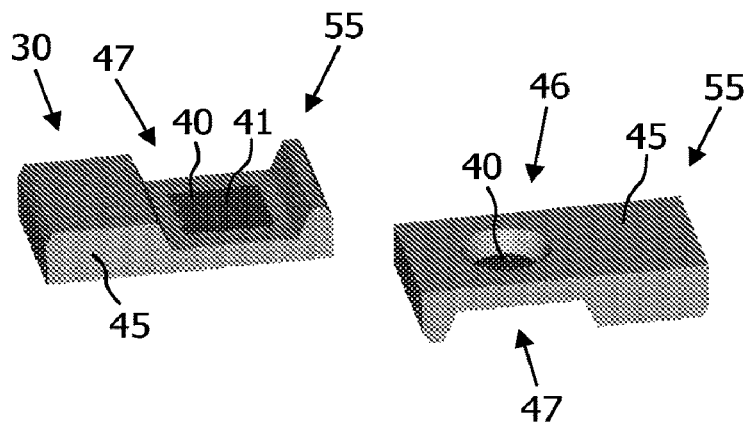

In a fourth step of the process of manufacturing the second package, which is illustrated by FIG. 3d, the carrier 20 is removed by chemical etching, peeling, or another suitable technique. The product that is obtained as the result of this step is also referred to as package carrier 55. At the under side of the package carrier 55, at the position where the elevated portion 22 of the carrier 20 has been, a through-like recess 47 has been formed, wherein the covering member 40 is present at the bottom of the recess 47. Furthermore, as a result of the removal of the carrier 20, the holes 41 of the covering member 40 are open.

Figure 3E:
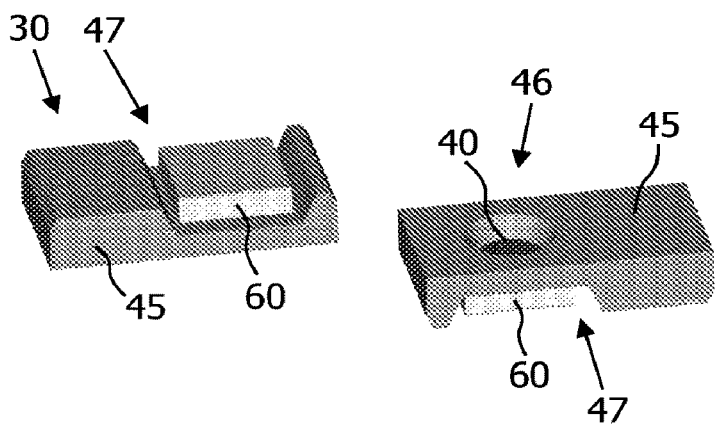

In a fifth step of the process of manufacturing the second package, which is illustrated by FIG. 3e, a MEMS microphone 60 or another suitable microelectronic element is placed in the recess 47 which is arranged in the under side of the body member 45. Furthermore, the MEMS microphone 60 is connected to the electrically conductive pattern 30 that is present at the under side of the body member 45.

Figure 3F:
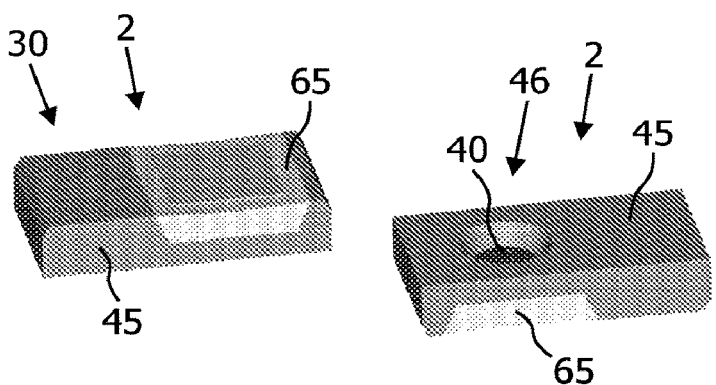

In a sixth step of the process of manufacturing the second package, which is illustrated by FIG. 3f, the recess 47 containing the MEMS microphone 60 is closed by filling the recess 47 with a suitable material such as epoxy resin. In the process, the MEMS microphone 60 gets encapsulated in a filler body 65 which is formed in this way. This step of closing the recess 47 is the final step of the formation of the second package 2. In case the package 2 is manufactured as part of an array 50 of packages 2, and has not been separated from the other packages 2 yet, a process of dicing the array is performed.

By carrying out the manufacturing method as described above, a compact and robust package 2 is realized, in which the MEMS microphone 60 and the processor chip 61 are protected from damage. Nevertheless, the MEMS microphone 60 may be reached by sound waves, through the holes 41 in the covering member 40. Furthermore, the electric circuit containing the electrically conductive pattern 30, the MEMS microphone 60 and the processor chip 61 is easily connectable to another electronic device, through the tracks 32 and connection pads 31 of the pattern 30, which are present at the under side of the body member 45, while extending outside of the recess 47.

FIGS. 4a to 4i illustrate subsequent steps of a process of manufacturing a diagnostic device according to a second preferred embodiment of the present invention. In the following, the manufacturing process will be described for one diagnostic device. Nevertheless, the diagnostic device may be manufactured as part of an array of devices.

In each of FIGS. 4c to 4h, both a perspective view of an under side of the diagnostic device in the process of formation and a perspective view of an upper side of the diagnostic device in the process of formation are shown. Furthermore, in FIG. 4i, both a perspective view of an under side of a microfluidic plate of the diagnostic device and a perspective view of an upper side of this microfluidic plate are shown.

Figure 4A:
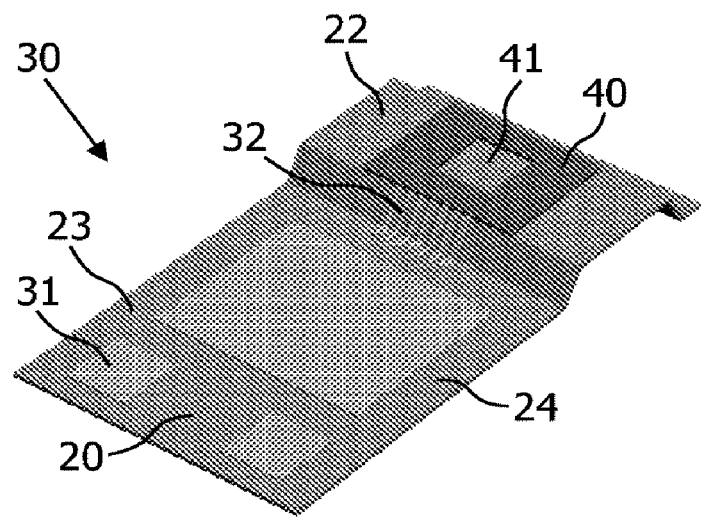

In a first step of the process of manufacturing the diagnostic device, which is illustrated by FIG. 4a, a sacrificial carrier 20 is provided. The carrier 20 comprises a sheet of material, for example copper. At a carrying surface 24, the carrier 20 is provided with a pattern 30 of electrically conductive connection pads 31 and electrically conductive tracks 32.

The carrier 20 is bent in such a way that two portions 22, 23 which are located at a different level are obtained. In particular, after bending of the carrier 20 has taken place, an elevated portion 22 and a recessed portion 23 of the carrying surface 24 are discernible. At the elevated portion 22 of the carrying surface 24 of the carrier 20, a covering member 40 is arranged in the form of a thin layer of electrically insulating material having a hole 41.

Figure 4B:
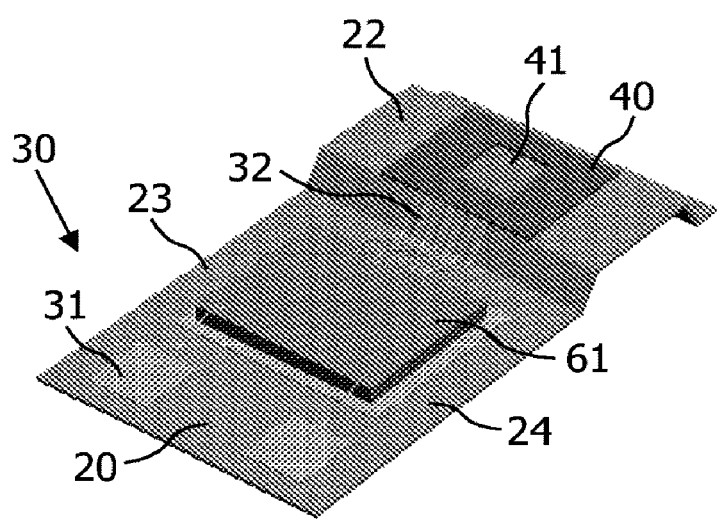

In a second step of the process of manufacturing the diagnostic device, which is illustrated by FIG. 4b, a processor chip 61 or another suitable microelectronic element is positioned on the recessed portion 23 of the carrying surface 24, wherein electric connections between the processor chip 61 and both the electrically conductive connection pads 31 and the electrically conductive tracks 32 of the pattern 30 are realized.

Figure 4C:
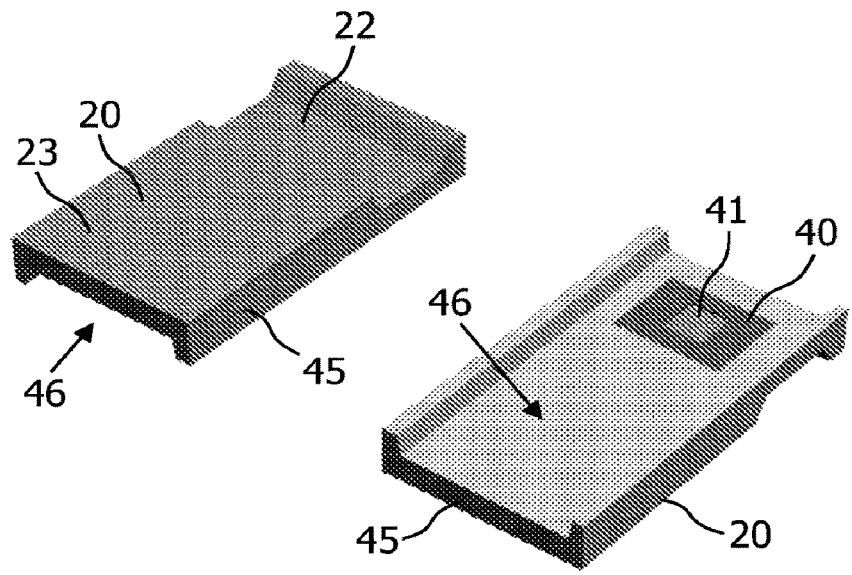

In a third step of the process of manufacturing the diagnostic device, which is illustrated by FIG. 4c, the carrier 20 and the components 30, 40, 61 arranged on its carrying surface 24 are overmolded with a suitable material, on the basis of which a body member 45 is formed on the carrier 20, at the side of the carrying surface 24. In the process, the processor chip 61 gets encapsulated in the body member 45. Furthermore, in the process, a trough-like recess 46 is formed in the body member 45, wherein a top side of the covering member 40 is located at a bottom of the recess 46. The body member 45 may be created and shaped by positioning the carrier 20 and the components 30, 40, 61 arranged on its carrying surface 24 in a mould and introducing material for forming the body member 45 in this mould, in a manner which is similar to the manner which has been already been discussed in respect of the manufacturing process of the first package 1.

Figure 4D:
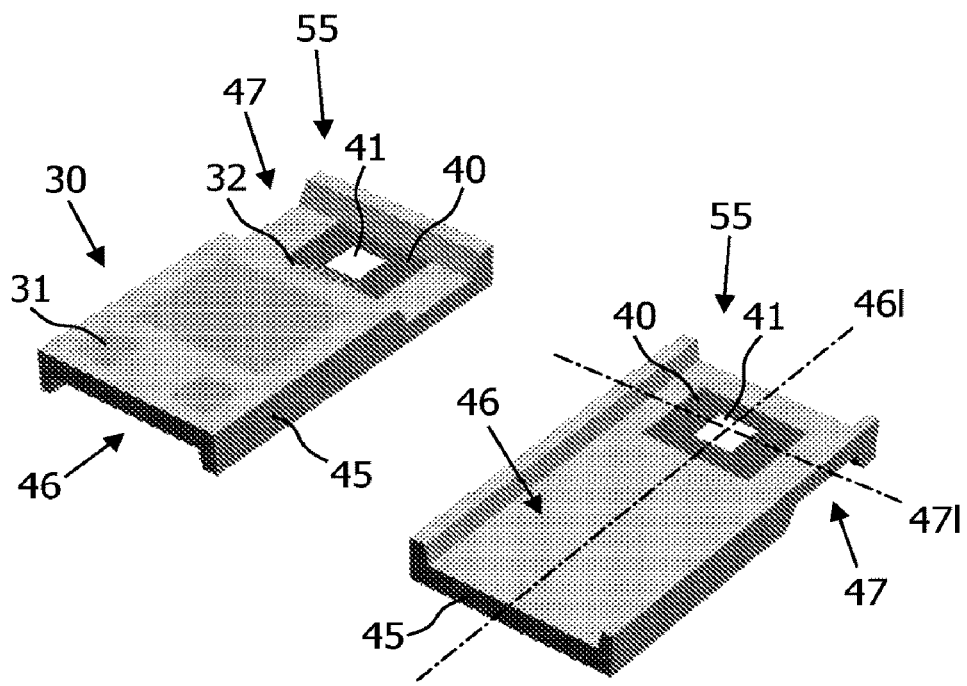

In a fourth step of the process of manufacturing the diagnostic device, which is illustrated by FIG. 4d, the carrier 20 is removed by chemical etching, peeling, or another suitable technique. The product that is obtained as the result of this step is also referred to as package carrier 55. At the under side of the body member 45, at the position where the elevated portion 22 of the carrier 20 has been, a through-like recess 47 has been formed, wherein the covering member 40 is present at a bottom of the recess 47. Furthermore, as a result of the removal of the carrier 20, the hole 41 of the covering member 40 is open.

Figure 4E:
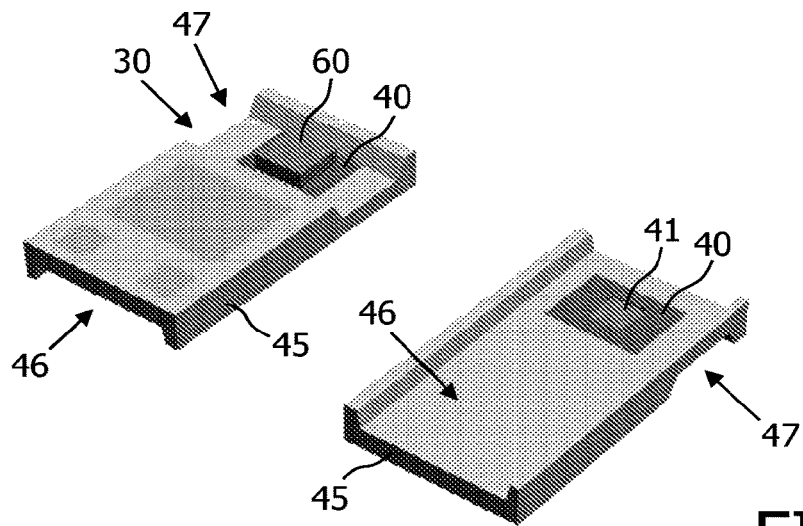

In a fifth step of the process of manufacturing the diagnostic device, which is illustrated by FIG. 4e, a sensor die 60 or another suitable microelectronic element is placed in the recess 47 which is arranged in the under side of the body member 45. Furthermore, the sensor die 60 is connected to the electrically conductive pattern 30 that is present at the under side of the body member 45.

Figure 4F:
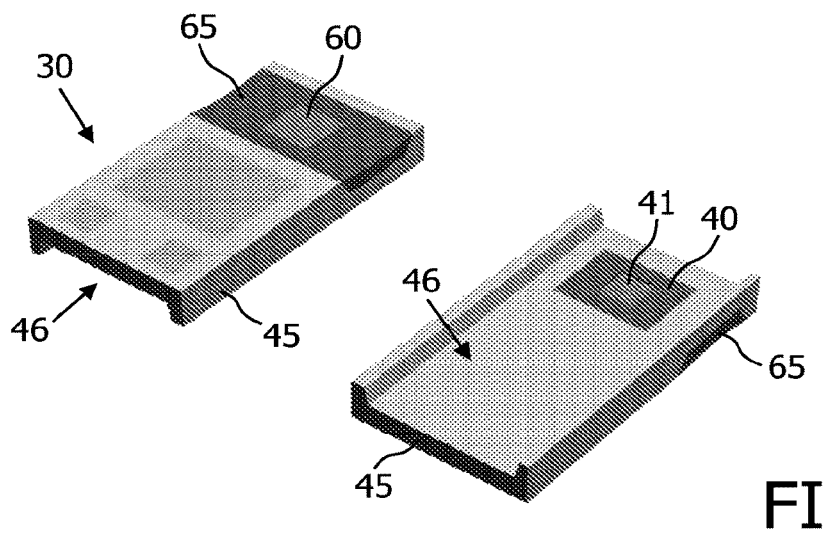

In a sixth step of the process of manufacturing the diagnostic device, which is illustrated by FIG. 4f, the recess 47 containing the sensor die 60 is closed by filling the recess 47 with a suitable material such as epoxy resin. In the process, the sensor die 60 gets encapsulated in a filler body 65 which is formed in this way.

Figure 4G:
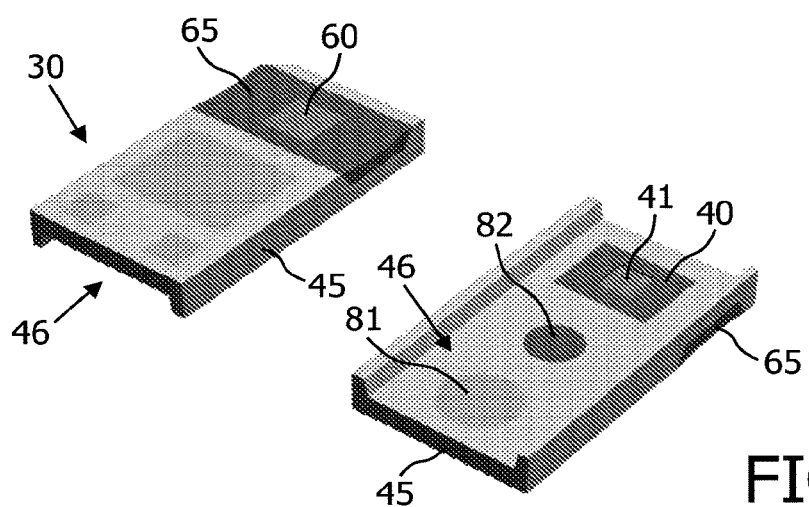

In a seventh step of the process of manufacturing the diagnostic device, which is illustrated by FIG. 4g, reagents 81, 82 are applied to the bottom of the open recess 46 that is located at an upper side of the body member 45.

Figure 4H:
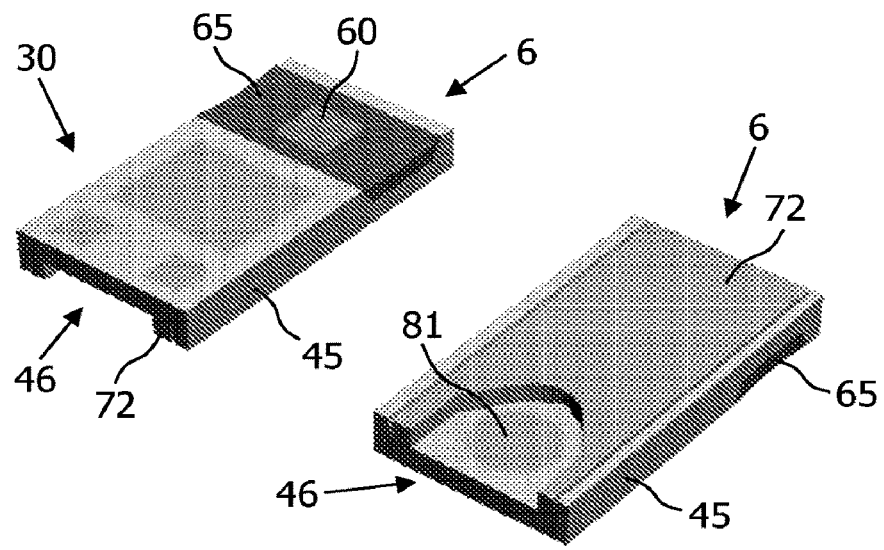
Figure 4I:
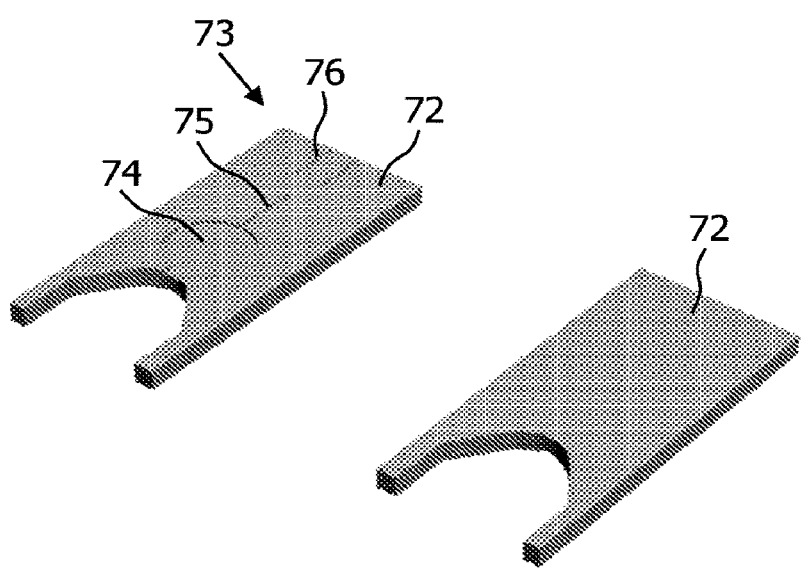

In an eighth step of the process of manufacturing the diagnostic device, which is illustrated by FIG. 4h, a microfluidic plate 72, which has a pattern 73 of channels for conducting a fluid, which is present at one side of the plate 72, is placed in the recess 46, such that the side of the plate 72 having the pattern 73 of channels faces the bottom of the recess 46. The microfluidic plate 72 is shown in FIG. 4i. In the shown example, the microfluidic plate 72 is adapted to leaving one of the reagents 81, 82 uncovered. For the purpose of putting fluid into contact with another of the reagents 81, 82, the microfluidic plate 72 comprises a channel 74 which is shaped like a circular recess. For the purpose of supplying the fluid to the sensor die 60, through the hole 41 in the covering member 40, the microfluidic plate 72 comprises a supply channel 75. Furthermore, for the purpose of discharging the fluid from the hole 41, the microfluidic plate 72 comprises two discharge channels 76.

Within the scope of the present invention, the microfluidic plate 72 may have any suitable shape and comprise any suitable pattern 73 of channels, wherein it is important that the design of the microfluidic plate 72 is adapted to conducting fluid over the reagents 81, 82 and a sensitive surface of the sensor die 60, through the hole 41 in the covering member 40. Furthermore, the microfluidic plate 72 may be manufactured from any suitable material. In this respect, an example of a suitable material is plastic.

In the diagnostic device 6 which is obtained as a result of the manufacturing process as described on the basis of FIGS. 4a to 4i, the sensor die 60 is safely embedded in the filler body 65, and the processor chip 61 is safely embedded in the body member 45. The recess 47 in which the sensor die 60 is located is obtained in an easy manner, namely by bending a sacrificial carrier 20 in such a way that portions 22, 23 which are located at a different level obtained. At the location of an elevated portion 22 which is formed in the carrier 20 in this way, the recess 47 is automatically obtained when the carrier 20 is covered by material for the purpose of forming the body member 45.

An electric circuit of the diagnostic device 6, which comprises the sensor die 60 and the processor chip 61, is connectable to a read-out unit or another electronic device by means of connection pads 31 which lay exposed on the under side of the device 6.

An advantageous feature of the diagnostic device 6 is constituted by the fact that the covering member 40 may be relatively thin, so that the sensitive surface of the sensor die 60 may almost be at the same level as the bottom of the recess 46. As a consequence, it is ensured that the diagnostic device 6 is capable of yielding accurate results during its operation, as the fluid to be examined is passed over the sensitive surface of the sensor die 60 in a controlled manner, wherein the flow of the fluid is practically not disturbed at the location of the hole 41.

Advantageously, longitudinal axes 46l, 47l of the recesses 46, 47 which are arranged in the body member 45 of the diagnostic device 6 extend in directions which are at right angles with respect to each other, so that an area where the device 6 only comprises the relatively thin covering member 40 is as small as possible. In this way, the diagnostic device 6 may still be as robust as possible. It is noted that the directions in which the longitudinal axes 46l, 47l as mentioned are extending do not necessarily need to be at right angles with respect to each other for the purpose of having a robust device 6. In general, this effect is obtained when the directions in which these longitudinal axes 46l, 47l are extending differ from each other.

The packages 1, 2 and the diagnostic devices 5, 6 as described in the foregoing are only a few of the numerous possibilities existing within the scope of the present invention. The disclosed packages 1, 2 and diagnostic devices 5, 6 are as small as possible, and do not comprise unnecessary space.

The manufacturing processes of the packages 1, 2 and the diagnostic devices 5, 6 do not involve any complicated steps, and may be performed at low cost. Also, the applied materials do not need to be expensive.

Within the scope of the present invention, the number of microelectronic elements 60, 61 enclosed by the packages 1, 2 and the diagnostic devices 5, 6 may be chosen freely, in spite of the fact that in the foregoing, only examples of the application of just one microelectronic element 60 and examples of the application of two microelectronic elements 60, 61 have been described.

It will be clear to a person skilled in the art that the scope of the present invention is not limited to the examples discussed in the foregoing, but that several amendments and modifications thereof are possible without deviating from the scope of the present invention as defined in the attached claims.

In the foregoing, a method has been described for manufacturing a package 1, 2 enclosing at least one microelectronic element 60 such as a sensor die and having electrically conductive connection pads 31 for electric connection of the package 1, 2 to another device. In particular, this method comprises the steps of providing a sacrificial carrier 20; applying an electrically conductive pattern 30 to one side of the carrier 20; bending the carrier 20 in order to create a shape of the carrier 20 in which the carrier 20 has an elevated portion 22 and at least one recessed portion 23; forming a body member 45 on the carrier 20 at the side where the electrically conductive pattern 30 is present; removing the sacrificial carrier 20; and placing a microelectronic element 60 in a recess 47 which has been created in the body member 45 at the position where the elevated portion 22 of the carrier 20 has been, and connecting the microelectronic element 60 to the electrically conductive pattern 30. Furthermore, a hole 41 is arranged in the package 1, 2 for providing access to a sensitive surface of the microelectronic element 60, and another recess 46 is formed for the purpose of at least partially receiving a member 70, 72 for conducting fluid toward the hole 41.

The invention claimed is:

1. A package carrier, comprising:
   a body member having a recess for accommodating a microelectronic element; and
   a pattern of electrically conductive connection pads and electrically conductive tracks arranged at one side of the body member such that at least one of the electrically conductive connection pads is present in the recess;
   wherein the body member has at least one through hole at a bottom portion of the recess and the recess extends to the through hole,
   wherein the microelectronic element is arranged in the recess of the body member and connected to at least one of the electrically conductive connection pads present in the recess, said microelectronic element covering the through hole of the recess with one surface exposed to allow interaction between the one exposed surface and a fluid, and
   wherein the body member has another recess arranged at another side of the body member than the side where the recess and the electrically conductive pattern are present.

2. The package carrier according to claim 1, further comprising a covering member applied to the body member and having the at least one through hole of the body member.

3. The package carrier according to claim 1, wherein the recess with the microelectronic element is filled with an encapsulant.

4. The package carrier according to claim 1, wherein longitudinal axes of the recesses which are arranged at different sides of the body member extend in different directions.

5. The package carrier according to claim 1, wherein the microelectronic element is a sensor die.

6. The package carrier according to claim 3, wherein the encapsulant is an epoxy resin.

7. A package carrier, comprising:
   a body member having a recess for accommodating a microelectronic element; and
   a pattern of electrically conductive connection pads and electrically conductive tracks arranged at one side of the body member such that at least one the electrically conductive connection pads is present in the recess;
   wherein the body member has at least one through hole at a bottom portion of the recess and the recess extends to the through hole,
   wherein the microelectronic element is arranged in the recess of the body member and connected to at least one of the electrically conductive connection pads present in the recess, said microelectronic element covering the through hole of the recess with one surface exposed to allow interaction between the one exposed surface and a fluid, and
   wherein longitudinal axes of the recesses which are arranged at different sides of the body member extend in different directions.

8. The package carrier according to claim 7, further comprising a covering member applied to the body member and having the at least one through hole of the body member.

9. The package carrier according to claim 7, wherein the recess with the microelectronic element is filled with an encapsulant.

10. The package carrier according to claim 9, wherein the encapsulant is an epoxy resin.

11. The package carrier according to claim 7, wherein the microelectronic element is a sensor die.

* * * * *